United States Patent
Woelk et al.

(10) Patent No.: US 8,997,775 B2
(45) Date of Patent: *Apr. 7, 2015

(54) VAPOR DELIVERY DEVICE, METHODS OF MANUFACTURE AND METHODS OF USE THEREOF

(75) Inventors: Egbert Woelk, North Andover, MA (US); Ronald L. DiCarlo, Jr., Danville, NH (US)

(73) Assignee: Rohm and Haas Electronic Materials LLC, Marlborough, MA (US)

( * ) Notice: Subject to any disclaimer, the term of this patent is extended or adjusted under 35 U.S.C. 154(b) by 965 days.

This patent is subject to a terminal disclaimer.

(21) Appl. No.: 13/114,794

(22) Filed: May 24, 2011

(65) Prior Publication Data

US 2012/0298040 A1    Nov. 29, 2012

(51) Int. Cl.
| | | |
|---|---|---|
| *G05D 11/13* | (2006.01) | |
| *C23C 16/52* | (2006.01) | |
| *B01D 7/00* | (2006.01) | |
| *C23C 16/448* | (2006.01) | |
| *C23C 16/455* | (2006.01) | |

(52) U.S. Cl.
CPC . *C23C 16/52* (2013.01); *B01D 7/00* (2013.01); *C23C 16/4481* (2013.01); *C23C 16/45557* (2013.01); *C23C 16/45561* (2013.01); *G05D 11/138* (2013.01)

(58) Field of Classification Search
CPC . A61K 31/121; A61K 31/352; C07D 311/30; C07D 493/04; C23C 16/4481
USPC ............ 137/88, 89, 93, 109, 118.01, 118.04, 137/487.5, 110
See application file for complete search history.

(56) References Cited

U.S. PATENT DOCUMENTS

| | | |
|---|---|---|
| 5,553,395 A | 9/1996 | Wen et al. |
| 5,648,113 A * | 7/1997 | Barbee et al. ............. 427/8 |
| 6,027,760 A | 2/2000 | Gurer et al. |
| 6,216,726 B1 | 4/2001 | Brown et al. |
| 6,338,759 B1 | 1/2002 | Yu et al. |
| 6,424,800 B1 | 7/2002 | Kim |
| 6,444,041 B2 | 9/2002 | Vaartstra |

(Continued)

FOREIGN PATENT DOCUMENTS

| | | |
|---|---|---|
| EP | 2233603 A1 | 9/2010 |
| WO | WO2008064080 A1 | 5/2008 |

OTHER PUBLICATIONS

EP Exam Report for EP International Application No. 12166468.4 International Filing Date May 2, 2012; Issued Sep. 27, 2012; 7 pages.

(Continued)

*Primary Examiner* — William McCalister
(74) *Attorney, Agent, or Firm* — Cantor Colburn LLP

(57) ABSTRACT

A method comprises transporting a first stream of a carrier gas to a delivery device that contains a solid precursor compound. The first stream of carrier gas is at a temperature greater than or equal to 20° C. The method further comprises transporting a second stream of the carrier gas to a point downstream of the delivery device. The first stream and the second stream are combined to form a third stream, such that the dewpoint of the vapor of the solid precursor compound in the third stream is lower than the ambient temperature. The flow direction of the first stream, the flow direction of the second stream and the flow direction of the third stream are unidirectional and are not opposed to each other.

6 Claims, 6 Drawing Sheets

(56) References Cited

U.S. PATENT DOCUMENTS

| | | |
|---|---|---|
| 6,607,785 B2 | 8/2003 | Timmons et al. |
| 6,637,475 B2 | 10/2003 | Noah et al. |
| 6,868,869 B2 | 3/2005 | Orlander |
| 6,880,592 B2 | 4/2005 | Gregg et al. |
| 6,921,062 B2 | 7/2005 | Gregg et al. |
| 7,673,856 B2 | 3/2010 | Toda et al. |
| 7,722,720 B2 | 5/2010 | Shenai-Khatkhate et al. |
| 7,975,718 B2 | 7/2011 | Ngo et al. |
| 7,980,264 B2 | 7/2011 | Lynn |
| 8,501,266 B2 | 8/2013 | Woelk et al. |
| 2002/0007849 A1 | 1/2002 | Wang et al. |
| 2003/0072875 A1 | 4/2003 | Sandhu |
| 2004/0007180 A1 | 1/2004 | Yamasaki et al. |
| 2005/0095859 A1 | 5/2005 | Chen et al. |
| 2006/0115593 A1 | 6/2006 | Suzuki et al. |
| 2006/0133955 A1 * | 6/2006 | Peters ............................ 422/63 |
| 2007/0266949 A1 | 11/2007 | Shenai-Khatkhate |
| 2008/0044573 A1 | 2/2008 | Chen et al. |
| 2008/0047607 A1 | 2/2008 | Horsky et al. |
| 2008/0141937 A1 | 6/2008 | Clark |

OTHER PUBLICATIONS

EP Search Report for EP International Application No. 12166465.0 International Filing Date May 2, 2012; Issued Sep. 4, 2012; 3 pages.
EP Search Report for EP International Application No. 12166468.4 International Filing Date May 2, 2012; Issued Sep. 4, 2012; 3 pages.
EP Exam Report for EP International Application No. 12166465.0 International Filing Date May 2, 2012; Issued Sep. 27, 2012; 7 pages.
EP Exam Report for EP International Application No. 13175988.8 International Filing Date Jul. 10, 2013; Issued Feb. 7, 2014; 7 pages.
EP Search Report for EP International Application No. 13175988.8 International Filing Date Jul. 10, 2103; Issued Jan. 15, 2014; 6 pages.

* cited by examiner

VAPOR DELIVERY DEVICE, METHODS OF MANUFACTURE AND METHODS OF USE THEREOF

This disclosure relates to a vapor delivery device, methods of manufacture and methods of use thereof. In particular, this disclosure relates to a high output, high capacity delivery device for delivering solid precursor compounds in the vapor phase to reactors.

Semiconductors comprising Group III-V compounds are used in the production of many electronic and optoelectronic devices such as lasers, light emitting diodes (LEDS), photodetectors, and the like. These materials are used for manufacturing different monocrystalline layers with varying compositions and with thicknesses ranging from fractions of a micrometer to a few micrometers. Chemical vapor deposition (CVD) methods using organometallic compounds are generally employed for the deposition of metal thin-films or semiconductor thin-films, such as films of Group III-V compounds. Such organometallic compounds may be either liquid or solid.

In CVD methods, a reactive gas stream is generally delivered to a reactor to deposit the desired film for electronic and optoelectronic devices. The reactive gas stream is composed of a carrier gas, such as hydrogen, saturated with precursor compound vapor. When the precursor compound is a liquid, a reactive gas stream is obtained by passing (i.e. bubbling) a carrier gas through the liquid precursor compound in a delivery device (i.e. a bubbler).

Solid precursors however, are placed in a cylindrical vessel or container and subjected to a constant temperature below their melting points to vaporize them. A carrier gas is employed to entrain the solid precursor vapor and transport it to a deposition system. Depending on the substance, sublimation of a granular solid precursor by passing the carrier gas through it can lead to the formation of cavities in the granular bed. The extent of the cavities depends on the rate of flow of the carrier gas. Cavity formation is generally not observed at very low flow rates. At low carrier gas flow rates, the sublimation takes place on surfaces of the granular solid and the thickness of the sublimation layer is practically zero, i.e., it is almost two dimensional. As a result, the sublimation rate is uniform across the entire surface that is exposed to the carrier gas.

Higher carrier gas flow rates on the other hand push the boundaries of the sublimation layer deeper into the bed of granular solid precursor and the thickness of the sublimation layer is no longer zero. A granular material is practically never uniform and consequently the sublimation rates vary across the surface of the sublimation layer. Higher evaporation rates lead to faster material erosion and cavity formation. These cavities propagate in the general direction of the carrier gas flow. Eventually a cavity forms a channel through the entire bed of granular solid precursor. The carrier gas now by-passes the bed of the granular solid precursor and the controlled sublimation ceases.

The formation of channels results in poor and erratic delivery rates when used in conventional bubbler-type solid precursor delivery vessels. Such bubbler systems can result in a non-stable, non-uniform flow rate of the precursor vapor, especially when solid organometallic precursor compounds are used. Non-uniform organometallic vapor phase concentrations produce an adverse effect on the compositions of the films, particularly semiconductor films, being grown in metalorganic vapor phase epitaxy (MOVPE) reactors.

Delivery devices have been developed that attempt to address the problems of delivering solid precursor compounds to a reactor. U.S. Patent Publication No. 20080047607 to Horsky et al. is directed to a vapor delivery system for delivering a steady flow of sublimated precursor vapor to a vacuum chamber comprising a vaporizer of a solid precursor, a mechanical throttling valve, a pressure gauge and a vapor conduit to the vacuum chamber. The vapor delivery system includes a throttle valve-based sensing and control system capable of providing a vaporizer set-point temperature value to a regulator of a vaporizer heater that is capable of maintaining the vaporizer temperature at the set-point. The sensing and control system stores at least one predetermined valve displacement value representing a desired upper conductance limit for the throttle valve.

The sensing and control system is constructed to monitor the position of the throttle valve, and upon detecting the valve nearing or reaching that displacement value, the sensing and controller system raises the set-point temperature value to the regulator heater to cause increased vapor generation and vapor pressure upstream of the throttle valve, thereby to enable the closed loop control of the throttle valve to cause the valve to return to a substantially lower conductance position. The vapor delivery system includes a reference table of predetermined increments of temperature rise suitable for operation, and the sensing and control system effective, upon detecting the valve nearing or reaching the displacement value, to cause the vaporizer temperature set-point to be incremented to the next step in the reference table. This system however, restricts the flow of solid vapor to 0.1 standard cubic centimeters per minute (sccm) to 1 sccm, which is very low.

U.S. Patent Publication No. 2008/0044573 to Chen et al. details a method for monitoring and controlling delivery of a precursor from an ampoule in a process chamber. The method provides flowing a first carrier gas at a first flow rate through a vessel containing a chemical precursor to form a first precursor gas. The method further entails combining a second carrier gas at a second flow rate with the first precursor gas to form a second precursor gas, measuring a concentration of the chemical precursor within the second precursor gas, and calculating a mass flow rate of the chemical precursor.

The method however suffers from several drawbacks. One of these drawbacks entails using opposing directional flows of the first carrier gas and the second carrier gas, which leads to non-uniform mixing between the chemical precursor and the second carrier gas. When opposing flows are used as prescribed by Chen, if the pressure of the second carrier gas exceeds the pressure of the first carrier gas, then non-uniform sublimation of the solid precursor can occur, which can in turn cause a non-uniform supply of the chemical precursor to the reactor.

The method suffers from another drawback in that it entails supplying the second precursor gas to only a single processing chamber. It cannot be used to supply the precursor to multiple reactors because it does not balance competing demands from multiple reactors to permit a uniform supply of the chemical precursors to each of a plurality of reactors that are in communication with the delivery device.

There therefore remains a need for improved delivery devices and methods for delivering vapors of a solid precursor where the solid precursor is depleted in the delivery device and where the vapor concentration of the solid precursor remains uniform and at a sufficiently high concentration. It is also desirable to have a delivery device that can deliver a uniform and high flux of the precursor vapor throughout the process up to depletion of the solid precursor from the delivery device, while using carrier gas flows that are greater than 1 standard liter per minute.

Disclosed herein is a delivery system that comprises a delivery device having an inlet port and an outlet port; the delivery device containing a solid precursor; a first proportional valve; the first proportional valve being in communication with the inlet port of the delivery device; wherein the first proportional valve is operative to control the flow of a first stream of carrier gas to the delivery device based on an applied voltage; a second proportional valve; the second proportional valve being in communication with the outlet port of the delivery device; wherein the second proportional valve is operative to control the flow of a second stream of carrier gas to the delivery device based on an applied voltage; a mixing device; the mixing device being downstream of the delivery device and being operative to mix the first stream with the second stream; a chemical sensor; the chemical sensor being disposed downstream of the mixing chamber and being operative to analyze chemical contents of a fluid stream emanating from the mixing chamber; the chemical sensor being in communication with the first proportional valve; and a first pressure/flow controller being in operative communication with the chemical sensor and with the first proportional valve; wherein the delivery system is operative to deliver a substantially constant number of moles of a precursor vapor per unit volume of a carrier gas to a plurality of reactors that are communication with the delivery system.

Disclosed herein too is a method comprising transporting a first stream of a carrier gas to a mixing chamber via a delivery device; the delivery device containing a precursor compound; the first stream of carrier gas being at a temperature greater than or equal to 20° C.; transporting a second stream of the carrier gas to the mixing chamber; the mixing chamber being located at a point downstream of the delivery device; and combining the first stream and the second stream in the mixing chamber to form a third stream; where the first stream and the second stream flow opposite to each other prior to contacting one another.

The invention now will be described more fully hereinafter with reference to the accompanying drawings, in which various embodiments are shown. Like reference numerals refer to like elements throughout.

Figure 1:
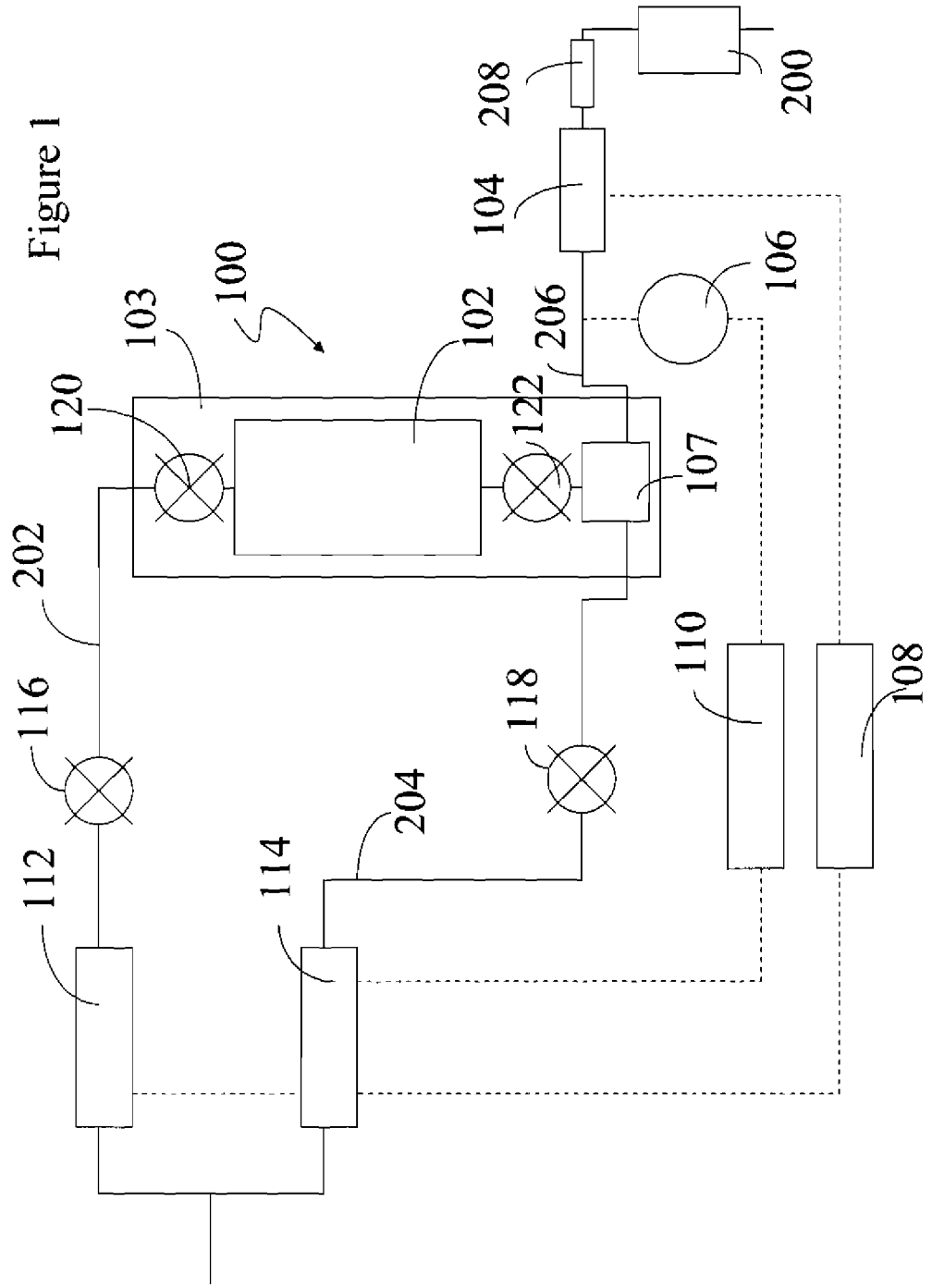
FIG. 1 is a schematic depiction of an exemplary delivery system where a delivery device is in fluid communication with one or more mass flow controllers which are each in fluid communication with a reactor vessel and where vapors from the delivery device are disposed on selected surfaces in the reactor.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

The transition term "comprising" encompasses the transition terms "consisting of" and "consisting essentially of".

Various numerical ranges are disclosed herein. These ranges are inclusive of the endpoints as well as numerical values between these endpoints. The numbers in these ranges are interchangeable.

Disclosed herein is a delivery system that comprises a delivery device in fluid communication with a reactor (comprising a mass flow controller and a reactor vessel) via a concentration sensor and a pressure sensor. The concentration sensor and the pressure sensor are in electrical communication with a first and a second pressure/flow controller respectively that control the flow of carrier gas through the delivery system. The delivery system uses a carrier gas stream that is split into two carrier gas streams, a first stream that flows into the delivery device and contacts a solid precursor compound and a second stream that bypasses the delivery device.

The splitting of the carrier gas into two streams permits a lower flow rate in the first stream relative to the second stream. The flow path of the entire first stream is also heated to an elevated temperature. The lower flow rate in the first stream when used in conjunction with the elevated temperature permits the entrainment of a higher volume of the precursor vapor while not forming channels and cavities. The amount of the precursor vapor transmitted per unit of time across a plane perpendicular to the direction of flow is termed the flux. In the present invention, the precursor vapor flux is higher in the first stream than the entire carrier gas stream in a comparative system where there is no stream that bypasses the solid precursor. This is because of the elevated temperature of the first stream. The elevated temperature of the first stream permits the entraining of a higher concentration of the precursor vapor when compared with a delivery system that does not have a bypass (i.e., a system where the entire volume of carrier gas passes through a container that carries the solid precursor), while at the same time not forming channels or cavities in the bed of the solid precursor compound.

The delivery system functions to deliver a uniform and constant concentration of the precursor vapors to the plurality of reactors. In another embodiment, the number of moles of precursor vapor per unit time delivered to the reactor are also kept constant.

The first stream with a high concentration (flux) of entrained vapors and the second stream that comprises only the carrier gas contact each other downstream of the delivery device to form a third stream. Since the second stream has a higher flow rate than the first stream, the combination of the first stream and the second stream to form the third stream results in the delivery of a higher flux of the precursor vapor to a reactor than a comparative device that does not use a bypass. As noted above, the delivery of a high flux of precursor vapor to the reactor is accomplished while eradicating the formation of channels and cavities in the solid precursor. In addition, the dew point of the third stream is below the temperature of the tubing and hardware that connects the delivery system and the reactor and condensation (deposition of the solid precursor inside the connecting tubing) is eliminated.

By reducing the vapor concentration in the third stream, the dewpoint of the vapor drops and vapor condensation in the connecting lines does not occur and a constant ratio of vapor to the carrier gas may be supplied to a reactor. The delivery system permits the adjustment of the dew point of the vapor, which is usually adjusted with reference to the temperature of the lines that transport the carrier gas to the delivery device.

The delivery system is advantageous in that it delivers a uniform and high flux of precursor vapor throughout the process up to depletion of the solid precursor from the delivery device. It permits carrier gas flows that are greater than or equal to 1 standard liters per minute (slm), specifically greater than or equal to 2 standard liters per minute, and more specifically greater than or equal to 3 standard liters per minute to a reactor. It is capable of delivering a flux of precursor vapor at rates of greater than or equal to 1,500 micromoles per minute, specifically greater than or equal to 1,750 micromoles per minute and more specifically 2,000 micromoles per minute at a temperature of 60° C. and a pressure of 900 torr.

The delivery system is also advantageous because it can provide the precursor vapors to be delivered to a plurality of reactors simultaneously. The delivery system balances competing demands from a plurality of reactors and can supply a stream having a uniform concentration of precursor vapors to each reactor irrespective of the volumetric demand from individual reactors. The delivery system can deliver a substantially constant concentration of the precursor vapors to each of the reactors. In one embodiment, the concentration of the precursor vapors per unit volume fluctuates in an amount of less than or equal to 3% over a period of time of 2 minutes to 60 minutes from a selected value, specifically in an amount of less than or equal to 2% over a period of time of 2 minutes to 60 minutes from the selected value, and more specifically in an amount of less than or equal to 1% over a period of time of 2 minutes to 60 minutes from the selected value.

The delivery system is unique in that it does not utilize any opposing flows without the presence of an optional mixing chamber. In other words, the delivery system does not use flows that contact each other from opposing directions. The system may employ an opposing flow only when an optional mixing chamber is used.

As noted above, the delivery system uses a mixing chamber. In one embodiment, the mixing chamber can be used when the delivery system does not use opposing flows. Interactions between the carrier gas and the precursor vapor in the mixing chamber facilitate better mixing thus ensuring a uniform delivery of the precursor vapor to the reactors. In another embodiment, the mixing chamber is used only when the delivery system employs opposing flows.

With reference now to the FIG. 1, a delivery system 100 comprises a delivery device 102 in communication with a mass flow controller 208 and a reactor 200 via a chemical sensor 104 and a pressure sensor 106 respectively. The chemical sensor 104 and the pressure sensor 106 are in operative communication with a first pressure/flow controller 108 and a second pressure/flow controller 110, respectively. The first pressure/flow controller 108 is in operative communication with a first proportional valve 112, while the second pressure/flow controller 110 is in operative communication with a second proportional valve 114 respectively. In an exemplary embodiment, the first pressure/flow controller 108 is in electrical communication with a first proportional valve 112, while the second pressure/flow controller 110 is in electrical communication with a second proportional valve 114 respectively.

The proportional valves 112 and 114 operate to control the flow of the carrier gases through the delivery system 100 when they are disposed upstream of the delivery device 102. The proportional valve 112 and can be disposed downstream of the delivery device and operate to control the flow of the carrier gas and the precursor vapor. Shutoff valves 116, 118, 120 and 122 are used to isolate the different components of the delivery device. In one embodiment, the shutoff valves 116 and 118 are open in normal operation.

When the voltage across the proportional valves 112 and 114 is increased, the valve opening is increased thereby increasing the flow of the carrier gas through the valve. On the other hand, when the voltage across the proportional valves is decreased, the valve opening is decreased thereby decreasing the flow of the carrier gas through the valve.

In one embodiment, the chemical sensor 104 along with the first pressure/flow controller 108, the first proportional valve 112, and the delivery device 102 form a first closed loop that encompasses the first stream 202 of carrier gas. The first stream 202 of carrier gas is directed to an inlet port (not shown) of the delivery device 102. The first stream is also referred to as the "source flow" stream since it contacts the solid precursor compound in the delivery device 102 and entrains precursor vapor. Since one of the functions of the first stream is to entrain precursor vapor, it is generally maintained at an elevated temperature. The elevated temperature is however, below the melting point of the precursor solid that is contained in the delivery device 102.

The first stream is generally maintained at a temperature of 20° C. to 80° C., specifically 30° C. to 75° C., specifically 40° C. to 70° C. The first stream 202 entrains vapors of the precursor compound while uniformly depleting the surface of the solid precursor compound that it contacts. This prevents the formation of channels and cavities in the mass of the solid precursor compound.

In another embodiment, the pressure sensor 106 along with the second pressure/flow controller 110, the second proportional valve 114, and the delivery device 102 form a second closed loop that encompasses a second stream 204 of carrier gas. The second stream 204 of carrier gas is directed to the outlet port of the delivery device 102. The second stream is also referred to as the "bypass flow" stream since it bypasses the solid precursor compound in the delivery device.

The first stream 202 after exiting the delivery device 102 combines with the second stream 204 to form a third stream 206 that enters the reactor 200 via the mass flow controller 208. The first stream 202 combines with the second stream 204 downstream of the outlet valve 122. The third stream 206 contains the desired amount of the precursor vapor in the carrier gas. The splitting of the carrier gas into two streams permits the first stream to be heated prior to entering the delivery device. As noted above, the first stream 202 and the second stream 204 do not oppose each other. In one embodiment, the first stream 202 and the second stream 204 flow in the same direction. In another embodiment, the first stream 202 and the second stream 204 meet each other at an angle of 1 to 90 degrees to form the third stream 206 that enters the reactor 200.

In one embodiment, an optional mixing chamber 107 may be used to combine the flows from the first stream 202 and the second stream 204. In the mixing chamber 107, the flows from the first stream 202 and the second stream 204 may be introduced in opposing directions. In another embodiment, the mixing chamber 107 may be used to combine the flow from the first stream 202 and the second stream 204 when these respective streams are not flowing in opposing directions. Both of these embodiments will be discussed in greater detail later.

By combining the first stream 202 with the second stream 204 to form the third stream 206, the concentration of the precursor vapor in the carrier gas is reduced resulting in a lower dewpoint of the precursor vapor. As a result, precursor vapor condensation does not occur when the vapor entrained carrier gas encounters a reduced temperature. This permits a constant ratio of precursor vapor to the carrier gas to be supplied to a reactor. In another embodiment, by reducing the dewpoint of the precursor vapor in the third stream to below the ambient temperature, precursor vapor condensation does not occur and a constant ratio of precursor vapor to the carrier gas may be supplied to a reactor.

The first and the second closed loops interact collaboratively with one another to control the delivery pressure and the precursor vapor concentration to one or a plurality of reactors 200. The flow rate of precursor into each reactor is controlled by the mass flow controller 208 associated with each reactor. The first and the second closed loops also interact collaboratively with one another to maintain the dewpoint of the precursor vapor below the ambient temperature. This prevents condensation of the precursor vapors and permits the transportation of a larger amount of precursor vapor to the reactor at a higher mass flow rate than other comparative commercially available systems. While the respective loops have been shown to be closed loops in the FIG. 1, it is envisioned that some of these loops can also be open loops if desired.

With reference again to FIG. 1, the delivery device 102 has an inlet valve 120 that can be used to start or stop the flow of the carrier gas into the delivery device 102. The delivery device 102 also has an outlet valve 122 that can start and stop the flow of the carrier gas with entrained precursor vapor from the delivery device 102 to the reactor 200. As may be seen in the FIG. 1, the delivery device 102 is in fluid communication with the reactor 200, such that precursor vapor from the delivery device 102 is disposed on selected surfaces in the reactor 200. A mass flow controller 208 admits the desired flow of the mixture to the reactor 200.

The mass flow controller 208 and the reactor 200 may comprise a single mass flow controller and reactor or a plurality of mass flow controllers and reactors (not shown). In an exemplary embodiment, the mass flow controller 208 and the reactor 200 comprises a plurality of mass flow controllers and reactors.

The delivery device 102 contains an inlet port (not shown) through which the carrier gas enters and an exit port (not shown) through which the carrier gas entrained with precursor vapor is discharged to the reactor 200. The inlet port of the delivery device 102 is in fluid communication with the inlet valve 120 while the exit port of the delivery device 102 is in fluid communication with the outlet valve 122. The delivery device 102 generally contains a packing material (not shown) and the solid precursor compound (not shown). The packing material is generally disposed between the solid precursor compound and the inlet port.

In one embodiment, the delivery device 102 is surrounded by a heating jacket 103 that serves to maintain the delivery device 102 at an elevated temperature. The heating jacket 103 may be heated by a fluid (e.g., a steam jacket) or by electrical energy. The heating jacket 103 serves to maintain the temperature of the gas stream (i.e., the carrier gas and the precursor vapor) in the system 100 at a temperature of greater than 20° C. at all times. The heating jacket 103 maintains the precursor compound in the delivery device 102 at a temperature of 20° C. to 80° C. In one embodiment, pipes or tubes that are used to transport the carrier gas to the delivery device are all maintained at a temperature of 20° C. to 80° C.

The delivery device 102 and the inlet and outlet ports may be manufactured from a material that is not deteriorated by the carrier gas or the solid precursor compound and that in turn does not change the composition of the carrier gas or the solid precursor compound. It is also desirable for the material to withstand the temperatures and pressures of operation. The enclosure may be manufactured from a suitable material, such as, for example, glass, polytetrafluoroethylene and/or a metal. In one embodiment, the enclosure is constructed of a metal. Exemplary metals include nickel alloys and stainless steels. Suitable stainless steels include SS304, SS304L, SS316, SS 316L, SS321, SS347 and SS430. Exemplary nickel alloys include INCONEL, MONEL, and HASTELLOY.

A wide variety of packing materials (not shown) may be used in the delivery device 102 provided that they are inert to the solid precursor compound and the cylinder under conditions of use. In general, it is desirable that the packing material is flowable. For example, as the solid precursor compound is depleted from the cylinder, the level of the solid precursor compound in the cylinder will decrease and the packing material needs to flow such that it fills in any depressions in the surface of the precursor compound layer. Suitable packing materials include ceramics, glasses, clays, organic polymers, and combinations comprising at least one of the foregoing. Examples of suitable ceramic packing materials include alumina, silica, silicon carbide, silicon nitride, borosilicates, alumina silicates, and combinations comprising at least one of the foregoing.

The packing material may include a wide variety of shapes, such as beads, rods, tubes, horseshoes, rings, saddles, discs, saucers, or other suitable forms such as aciform, cruciform, and helicoids (coils and spirals). Combinations of different shapes may be used if desired. Packing materials are generally commercially available from a variety of sources. Although the packing material may be used as is, it may be cleaned prior to use.

The delivery device 102 generally contains an opening (not shown) through which the solid precursor is introduced. The solid precursor material may be added to the delivery device by any suitable means. The solid precursor compound may be added to the delivery device 102 in powder form or may be fitted (this will be discussed below). The volume ratio of solid precursor compound to packing material may vary over a wide range, such as 10:1 to 1:10. In one embodiment, the volume ratio is 1:4 to 4:1.

The solid precursor compound is the source of the precursor vapor. Any solid precursor compound suitable for use in vapor delivery systems may be used in the delivery device. Suitable precursor compounds include indium compounds, zinc compounds, magnesium compounds, aluminum compounds, gallium compounds, and combinations comprising at least one of the foregoing compounds.

Exemplary solid precursor compounds include trialkyl indium compounds such as trimethyl indium (TMI) and tritertiarybutyl indium; trialkyl indium-amine adducts; dialkyl haloindium compounds such as dimethyl chloroindium; alkyl dihaloindium compounds such as methyl dichloroindium; cyclopentadienyl indium; trialkyl indium; trialkyl arsine adducts such as trimethyl indium-trimethyl arsine adduct; trialkyl indium-trialkyl-phosphine adducts such as trimethyl indium-trimethyl phosphine adduct; alkyl zinc halides such as ethyl zinc iodide; cyclopentadienyl zinc; ethylcyclopentadienyl zinc; alane-amine adducts; alkyl dihaloaluminum compounds such as methyl dichloroaluminum; alkyl dihalogallium compounds such as methyl dichlorogallium; dialkyl halogallium compounds such as dimethyl chlorogallium and dimethyl bromogallium; biscyclopentadienyl magnesium ("$Cp_2Mg$"); carbon tetrabromide; metal beta-diketonates, such as beta-diketonates of hathium, zirconium, tantalum and titanium; metal dialkylamido compounds such as tetrakis(dimethylamino)hafnium; silicon compounds and germanium compounds such as bis(bis(trimethylsilyl)amino) germanium. In the aforementioned solid precursor compounds, the term "alkyl" refers to ($C_1$-$C_6$) alkyl. Mixtures of solid precursor compounds may be used in the present delivery devices.

The solid precursor compound may be fitted. As used herein, "fitting" refers to the fusing of the solid precursor compound. It has been found that a frit of solid precursor compound in a delivery device enables a more consistent, stable concentration of precursor compound in the vapor phase and provides better depletion of the solid precursor compound from the cylinder as compared with other conventional techniques or other commercially available devices. A "fit of solid precursor compound" refers to a fused cake of solid precursor compound having a substantially level top surface and sufficient porosity to allow the carrier gas to pass through the cake. In general, when the fit of solid precursor compound is first formed, it conforms to the internal dimensions of the cylinder, that is, the fit has a width substantially equal to the interior dimension of the inlet chamber. The height of the fit will depend upon the amount of solid precursor compound used.

A suitable carrier gas may be used with the delivery device 102 as long as it does not react with the solid precursor compound. The particular choice of carrier gas depends upon a variety of factors such as the precursor compound used and the particular chemical vapor deposition system employed. Suitable carrier gases include inert gases. Exemplary gases are hydrogen, nitrogen, argon, helium, and the like.

The chemical sensor 104 is a concentration sensor and measures the concentration of the precursor vapor in the carrier gas. The chemical sensor 104 controls the mass transfer rate of the precursor vapor into the reactor by continually monitoring gas concentration and controlling the first stream 202 through the delivery device 102 to account for concentration changes and/or drift.

In one embodiment, the chemical sensor 104 is an in-line acoustic binary gas concentration sensor used for sensing the ratio of the precursor vapor to the carrier gas. The chemical sensor generates an acoustic signal that travels through the gas mixture (i.e., the mixture of the vapor of the precursor compound and the carrier gas), using a digital signal processing technique to precisely measure the time of travel of the acoustic signal. The time of travel is then used to calculate the concentration of the precursor vapor in the carrier gases based upon their physical properties. This concentration measurement provides data that allows for control of the mass transfer rate of the precursor vapor while compensating for any variations in the concentration of the precursor vapor with respect to the carrier gas. This control in the mass transfer rate is brought about by the first proportional valve 112.

For example, when the output from the chemical sensor 104 is zero volts it indicates that the concentration of the precursor vapor in the carrier gas is 0 wt % (weight percent). When the output from the chemical sensor 104 is 5 volts, the concentration of the precursor vapor in the carrier gas is 1 wt %. In an exemplary embodiment, the chemical sensor 104 is a PIEZOCON®, commercially available from Lorex Industries.

In an exemplary embodiment, when the solid precursor compound is trimethylindium, the chemical sensor 104 is used to control the flow through the delivery device 102 to provide the delivery system 100 with a 17° C. dew point for the trimethylindium vapor. The transport plumbing (i.e., lines that transport the carrier gas and the precursor vapor) between the delivery device 102 and the mass flow controller 208 feeding the reactor 200 are generally maintained at room temperature of 20° C. In order to keep the trimethylindium vapors from condensing in the transport plumbing a dew point of 17° C. is selected for the trimethylindium. This 3° C. difference permits a continuous steady flow of the precursor vapor to the reactor.

The pressure sensor 106 measures the pressure across the delivery device 102. The pressure sensor 106 may be a pressure gauge, a manometer, or the like. The pressure sensor 106, in combination with the second controller 110, and the second proportional valve 114, provides a mechanism to control the pressure of the precursor vapor and the carrier gas.

Figure 5:
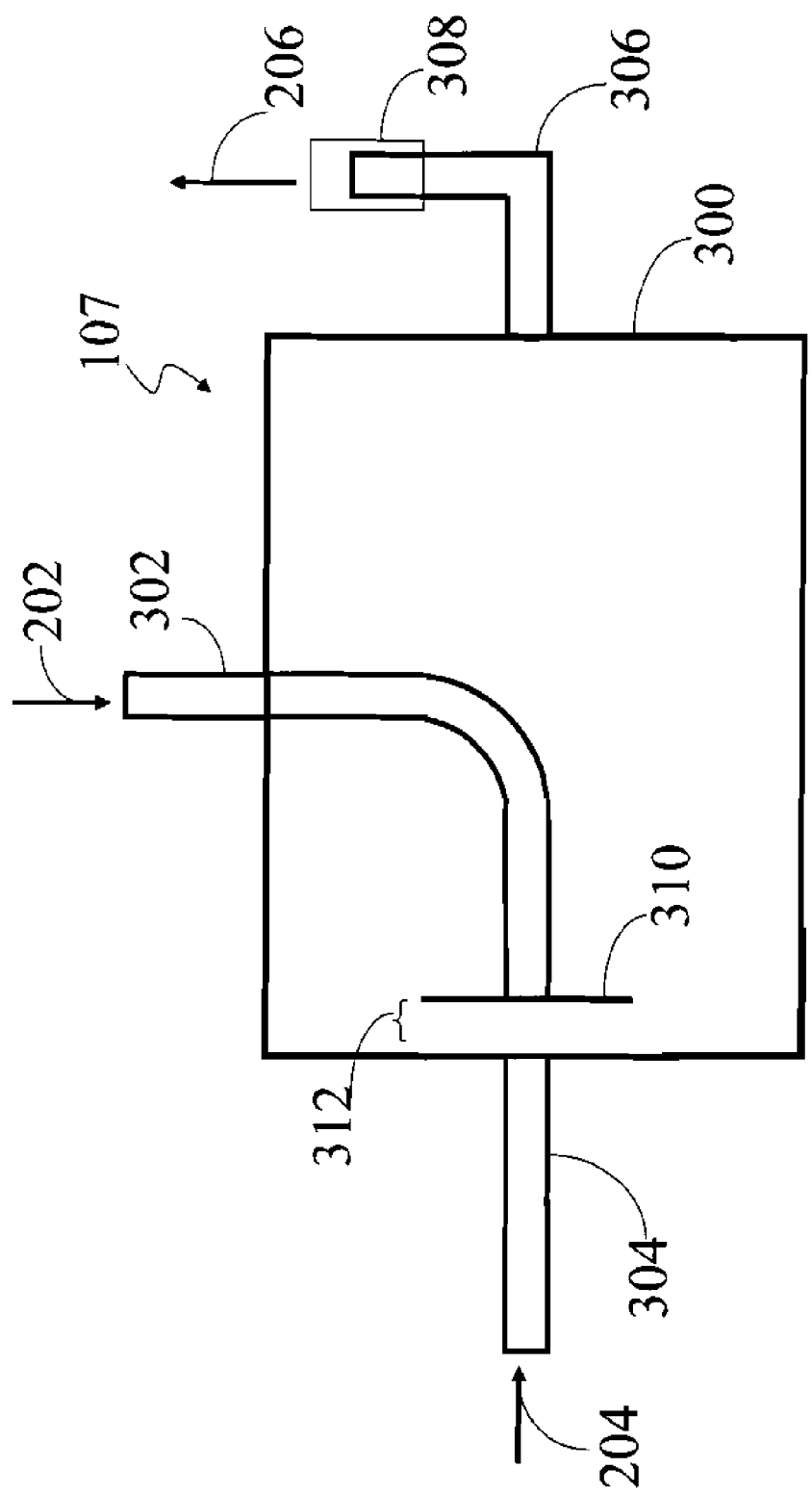
FIG. 5 is a schematic depiction of an exemplary mixing chamber.
Figure 6:
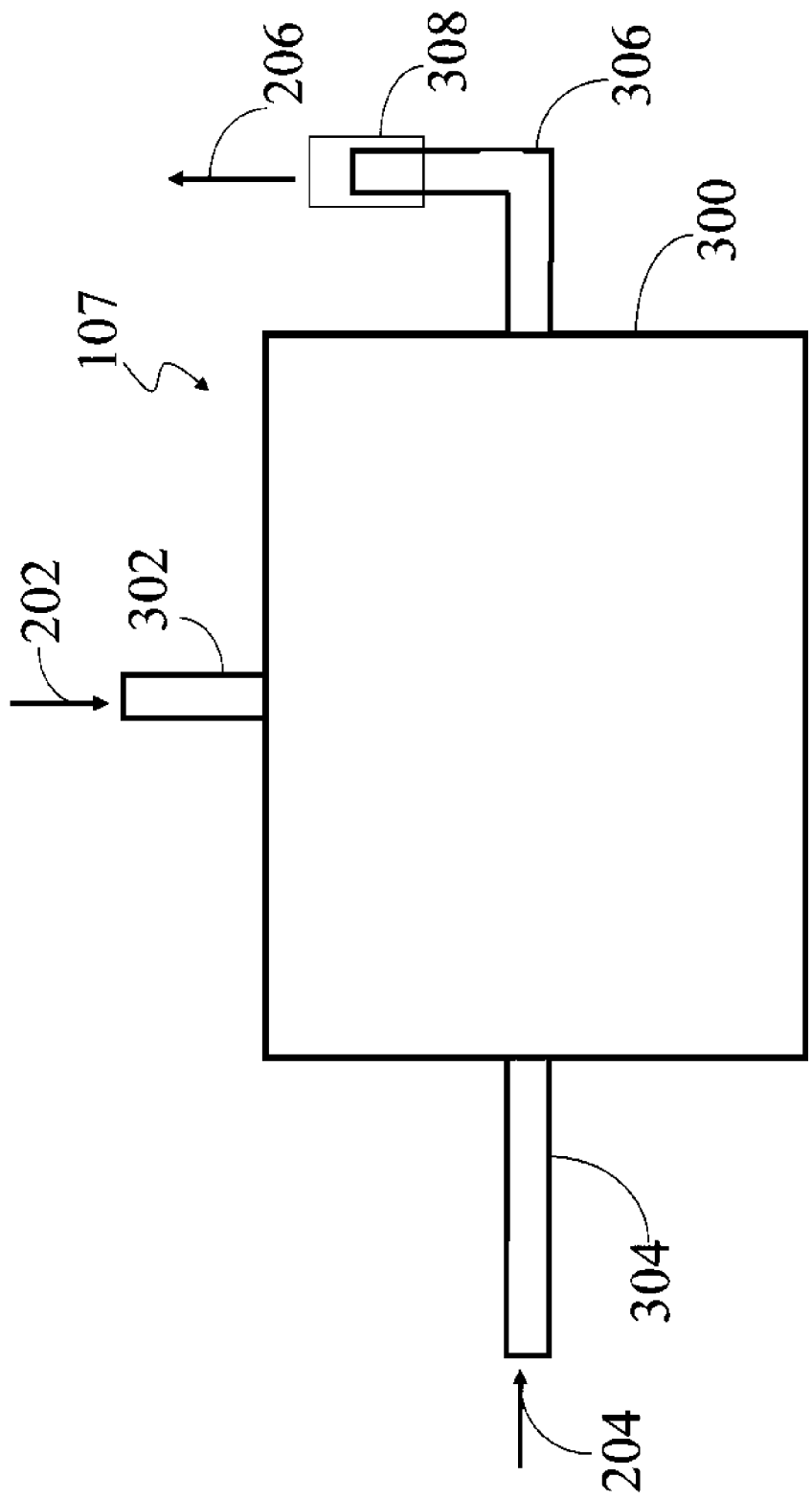
FIG. 6 is a schematic depiction of another exemplary mixing chamber.

The optional mixing chamber 107 is detailed in the FIGS. 5 and 6. The FIG. 5 shows the mixing chamber 107 when it contains opposing flows, while the FIG. 6 shows the mixing chambers 107 when it does not contain an opposing flow.

The FIG. 5 depicts the mixing chamber 107 having opposing flows for the first stream 202 and the second stream 204. The mixing chamber 107 comprises a chamber 300 that is manufactured from a nickel alloy or a stainless steel. The chamber 300 may have any shape but is preferably a cylinder with diameter and height being equal or nearly equal. In one embodiment, it is desirable to have a diameter of the mixing chamber be greater than or equal to 1 inches, specifically greater than or equal to 2 inches and more specifically greater than or equal to 3 inches. In another embodiment, the height of the cylinder is greater than or equal to 2 inches, specifically greater than or equal to 3 inches and more specifically greater than or equal to 4 inches.

The first stream 202 enters the chamber 300 via a conduit 302 while the second stream 204 enters the chamber 300 via a conduit 304. The third stream 206 leaves the chamber 300 via a conduit 306. The position of the mixing chamber 107, when it is used in the delivery system, allows it to be a part of the first closed loop and the second closed loop.

The respective conduits preferably have a circular cross-section with a diameter that is greater than or equal to 0.25 inches, specifically greater than or equal to 0.35 inches and more specifically greater than or equal to 0.5 inches. As may be seen in the FIG. 5, the outlets of the conduit 302 and 304 are opposed to each other. The outlets of conduits are designed to be opposed to each other and to be less than half an inch apart from each other so that the first stream 202 and the second stream 204 can be intimately mixed with each other prior to exiting the chamber via the conduit 306 as the third stream 206. The conduit 306 is provided with a device 308 for connecting the chamber 300 to a conduit that is in communication with an inlet (not shown) to the reactor 200.

The conduit 302 is fitted with a flange 310 that is parallel a side of the chamber 300 that communicates with the conduit 304. The flange 310 forces the first stream 202 and the second stream into an intimate mixture with each other in the space 312 between the flange 310 and the side of the chamber 300.

The FIG. 6 depicts the mixing chamber 107 having flows for the first stream 202 and the second stream 204 that are not opposed to each other. In this depiction, the first stream 202 enters the chamber 300 via the conduit 302, while the second stream 204 enters the chamber 300 via the conduit 304. The meeting of the two streams in the chamber 300 brings about mixing between the two streams 202 and 204, which then depart the chamber 300 as the third stream 206 via the conduit 306. In the embodiments depicted in the FIGS. 5 and 6, the conduits 302, 304 and 306 may contain nozzles, porous filters, or other devices that are used to enhance mixing of the first stream 202 with the second stream 204. The mixing chamber may also contain packing materials such as beads, rods, tubes, horseshoes, rings, saddles, discs, saucers, or other suitable forms such as aciform, cruciform, and helicoids (coils and spirals). Combinations of different packing materials listed above may be used if desired. The mixing chamber 107 may be used in any of the embodiments depicted in the following FIGS. 2-4 at the point where the first stream 202 contacts the second stream 204.

With reference once again to the FIG. 1, the first controller 108 and the second controller 110 are self-contained proportional-integral-derivative (PID) control modules that are designed to provide optimized control of the total pressure or flow of the carrier gas through the delivery system 100. The input for the first proportional valve 112 is obtained from the pressure sensor 106. The input for the second proportional valve 114 is obtained from the chemical sensor 104. Each pressure/flow control system comprises three basic parts, notably a process sensor, a proportional-integral-derivative controller and a control element.

In the operation of the first proportional valve 112, the chemical sensor 104 measures the process pressure or carrier gas flow rate. The proportional-integral-derivative controller compares the measured concentration of the precursor to the desired set point and adjusts the proportional valve 112 as necessary to achieve the desired precursor vapor concentration in the third stream 206.

In the operation of the second proportional valve 114, the pressure sensor 106 controls the bypass flow to maintain the programmed pressure. The precursor vapor demands of the reactor 200 are made by the mass flow controller 208. In response, the pressure sensor 106 in conjunction with the flow controller 110 and the second proportional valve 114 adjusts the flow of the carrier gas in the second stream 204 to provide the desired pressure in the third stream 206.

In one embodiment, a plurality of pressure/flow controllers can be slaved to a master pressure/flow controller, which adjusts the total flow of the carrier gases to achieve the desired pressure, while the chemical sensor 104 and the associated controller 108 maintains the desired gas ratio/mixture. For example, the first proportional valve 112 and the second proportional valve 114 from the FIG. 1 can be slaved to a main pressure controller (not shown) to divide the total flow of the carrier gases to the first stream 202 and the second stream 204. There would be no active control of the concentration in this embodiment.

The shutoff valves 116 and 118 and the inlet and outlet valves 120, 122 may be gate valves, ball valves, butterfly valves, needle valves, or the like.

In one embodiment, in one manner of utilizing the delivery system 100 of the FIG. 1, the reactor 200 draws vapor from the delivery device 102. The carrier gas can be delivered by either the first proportional valve 112 or the second proportional valve 114 or both depending upon the information provided by the chemical sensor 104 and the pressure sensor 106.

In one embodiment, the carrier gas is generally heated to a temperature not greater than the melting point of the solid precursor compound as it travels through the fluid lines (e.g., pipes or tubes) that include the first stream 202 and the second stream 204. The carrier gas in the first stream 202 travels through the delivery device 102 and entrains the vapors of the precursor compound. The carrier gas with the vapor entrained therein then meets with the carrier gas in the second stream 204. By adjusting the mass flow of the carrier gas in the first stream 202 and the second stream 204, the concentration of the precursor vapor can be maintained at a desired amount.

The "desired amount" is determined by settings of the chemical sensor 104 and the pressure sensor 106 and the respective pressure/flow controllers 108 and 110. The concentration of the precursor vapor in the third stream 206 is measured by the chemical sensor 104. The pressure and/or the flow rate of the carrier gas (with precursor vapor entrained therein) are measured by the pressure sensor 106.

When the concentration of the precursor vapor relative to the carrier gas deviates from a desired amount or a desired range, the chemical sensor 104 communicates with the controller 108 and with the proportional valve 112 to adjust the flow of the carrier gas to the delivery device 102. By adjusting proportional valve 112, the amount of the precursor vapor in the carrier gas in the stream 206 can be adjusted to be substantially constant. The flow rate of the carrier gas with the entrained precursor vapor in the third stream 206 depends on the demand of the mass flow controller 208 and is controlled by the second controller 110 and the second proportional valve 114.

For example, when the concentration of precursor vapor drops relative to the carrier gas in the third stream 206, an electrical communication from the chemical sensor 104 to the controller 108 and the first proportional valve 112 increases the flow of the carrier gas via the first stream 202 that includes the valve 116 and the inlet valve 120. This increases the amount of the precursor vapor in the carrier gas in the first stream 202. The mass flow of the carrier gas in the second stream 204 is reduced by the amount of the flow increase in the first stream 202. The increase in the amount of the precursor vapor in the first stream 202 when combined with the reduced mass flow rate in the second stream 204 produces a third stream 206 that has a concentration of precursor vapor that is substantially constant when compared with the amount of precursor vapor prior to the decrease that brought about the adjustment in the flow rate of the first stream 202.

In another embodiment, when the concentration of precursor vapor increases in the third stream 206, an electrical communication from the chemical sensor 104 to the controller 108 and the proportional valve 112 decreases the flow of the carrier gas via the first stream 202. This leads to an increase of the amount of the carrier gas flow in the second stream 204. The increase in the amount of the carrier gas in the second stream 204 when combined with the decreased mass flow rate in the first stream 202 produces a third stream 206 that has a concentration of precursor vapor that is substantially constant when compared with the amount of precursor vapor prior to the decrease that brought about the adjustment in the flow rate of the second stream 204.

The readings from the chemical sensor 104 and the pressure sensor 106 are thus used to adjust or to maintain the precursor vapor concentration and the flow rate of the precursor vapor to the reactor 200.

As noted above, the delivery system 100 described herein is advantageous in that it uses the first stream 202 (i.e., the source flow) and the second stream 204 (i.e., the bypass flow) to lower the dewpoint of the precursor vapor in the carrier gas to below the ambient temperature or more specifically the temperature of the connecting tubing and hardware carrying the third flow 206.

Figure 2:
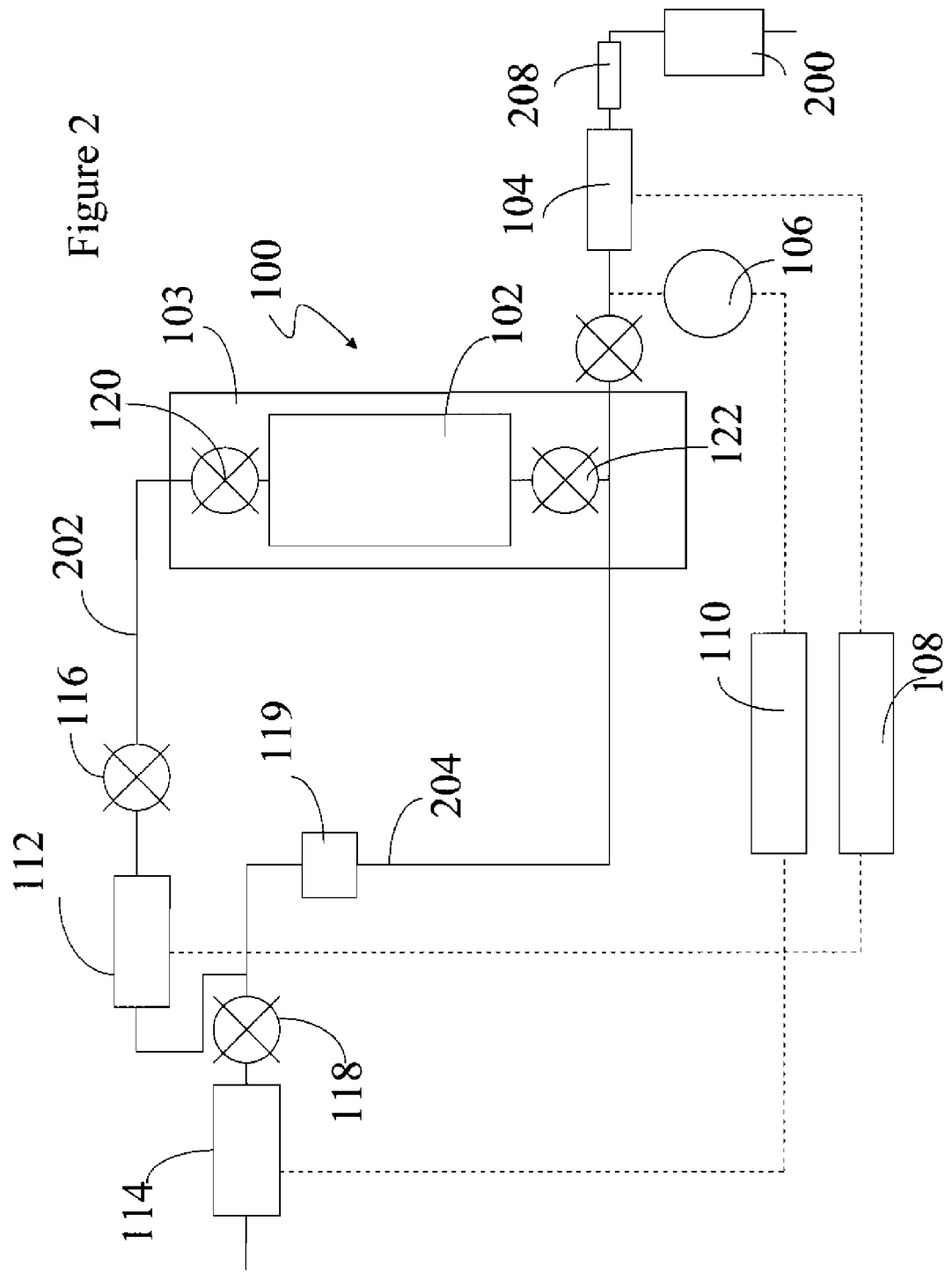
FIG. 2 is a schematic depiction of an exemplary delivery system where a single pressure/flow controller controls the flow rate through the delivery device.

The FIG. 2 depicts another embodiment of the delivery system 100 where the carrier gas is split into the first stream 202 (that flows through the solid precursor compound) and the second stream 204 (that bypasses the solid precursor compound) and is recombined to form the third stream 206, where the dewpoint is below the ambient temperature. The flow direction of the first stream 202, the flow direction of the second stream 204 and the flow direction of the third stream 206 are unidirectional and are not opposed to each other. As noted above, there are no opposing flows in the delivery system, except when a mixing chamber is used. This is because using opposing flows in the delivery system do not produce the desired mixing between the carrier gas and the precursor vapor, which results in the delivery an uneven distribution of the precursor vapor to the plurality of reactors.

The delivery system 100 in the FIG. 2 is almost similar to the delivery system of the FIG. 1 with the exception of the position of the second proportional valve 114 and a needle valve 119. In this depiction, a single proportional valve 114 driven by controller 110 connected to the pressure sensor 106 is used to control the pressure in the entire delivery system 100. The delivery system 100 of the FIG. 2 comprises at least two closed loops for adjusting the pressure and the precursor vapor concentration in the carrier gas.

As may be seen in the FIG. 2, the first proportional valve 112 lies downstream of the second proportional valve 114 and may optionally be slaved to the second proportional valve 114. A needle valve 119 lies downstream of the shutoff valve 118. The needle valve 119 facilitates an adjustable drop in pressure that can be used to adjust the flow of the carrier gas through the first proportional valve 112 and the delivery device 102.

Figure 3:
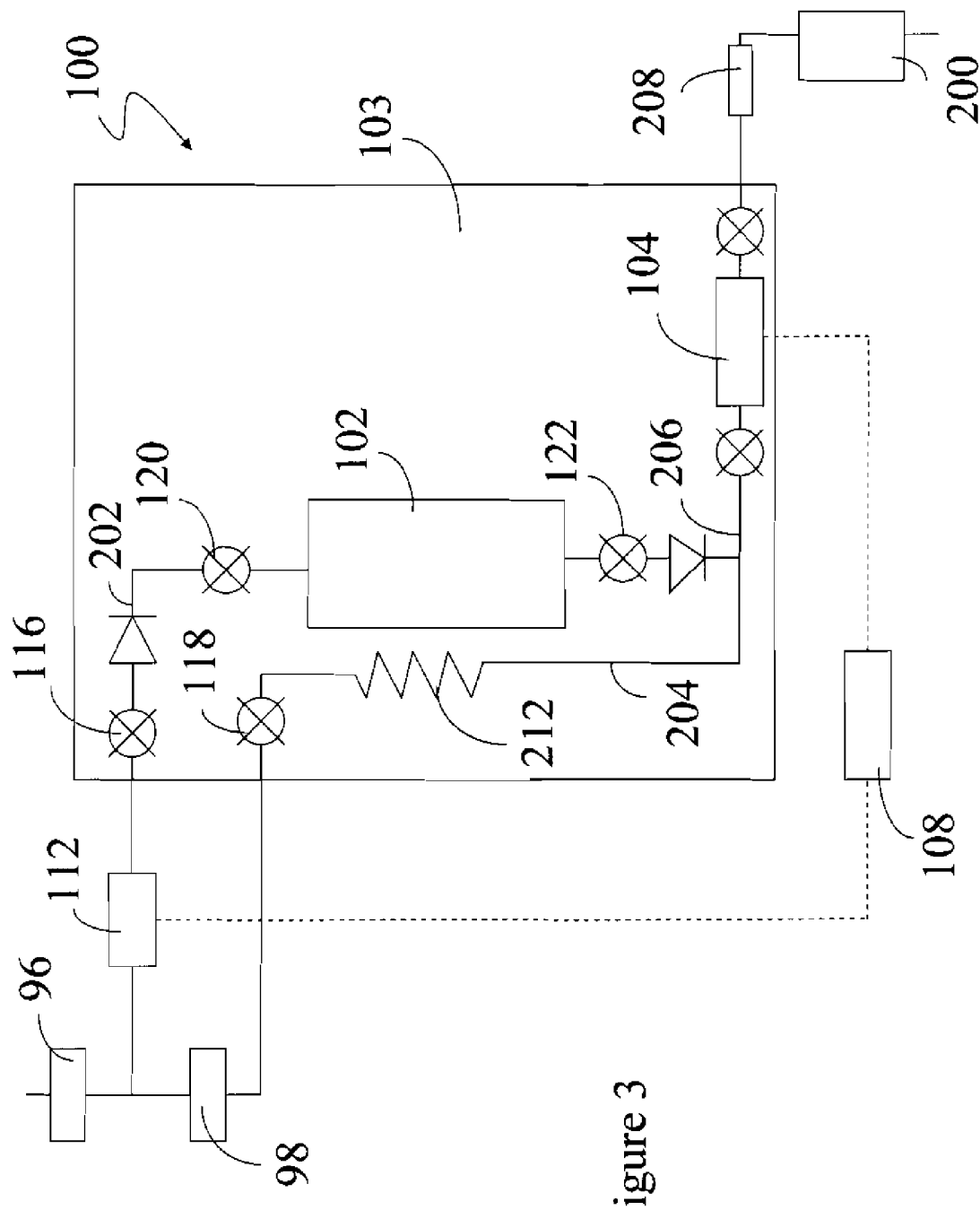
FIG. 3 is another schematic depiction of an exemplary delivery system where a single pressure/flow controller controls the mass flow rate through the delivery device.

The FIG. 3 depicts yet another embodiment of the delivery system 100 that comprises a plurality of pressure regulators in communication with the delivery device 102. The pressure regulators function to promote a drop in the pressure of the incoming carrier gas to a pressure level that is used for the mass flow controller 208.

In this embodiment, the delivery system 100 comprises a first pressure regulator 96 and a second pressure regulator 98 that lies downstream of the first pressure regulator 96. The first pressure regulator 96 facilitates a drop in pressure of the incoming carrier gas from a first pressure $P_1$ to a second pressure $P_2$, while the second pressure regulator 98 facilitates a further drop in the pressure from the second pressure $P_2$ to a third pressure $P_3$. The first pressure $P_1$ is greater than or equal to the second pressure $P_2$, which is greater than or equal to the third pressure $P_3$.

In one embodiment, the second pressure $P_2$ is 50% to 70% of the first pressure $P_1$, specifically 55% to 65% of the first pressure $P_1$. In an exemplary embodiment, the second pressure $P_2$ is 58% to 62% of the first pressure $P_1$. The third pressure $P_3$ is 40% to 48% of the first pressure $P_1$, specifically 43% to 47% of the first pressure $P_1$.

The first pressure $P_1$ is 1,900 to 2,100 torr (250 to 280 kPa), specifically 1,950 torr to 2,050 torr (260 to 275 kPa). The second pressure $P_2$ is 950 torr to 1,400 torr (125 to 190 kPa), specifically 1,000 torr to 1,300 torr (130 to 175 kPa). The third pressure $P_3$ is 500 to 950 torr (65 to 125 kPa), specifically 850 torr to 925 torr (110 to 120 kPa). The delivery device 102 can thus operate in conjunction with a reactor 200 whose inlet pressure is 500 to 2,000 torr (65 to 260 kPa), specifically 700 to 1800 torr (90 to 240 kPa), and more specifically is 900 torr (120 kPa). The reactor 200 by operating in the range between 50 and 760 torr (6 to 101 kPa) thus extracts via the mass flow controller 208 from the delivery device 100 the precursor vapor it desires.

Disposed downstream of the first pressure regulator 96 are the first proportional valve 112, a shutoff valve 116, the inlet valve 120, the delivery device 102, the outlet valve 122 and the chemical sensor 104. The first proportional valve 112 is disposed downstream of the first pressure regulator 96 and upstream of the second pressure regulator 98.

The first pressure regulator 96 is in fluid communication with the first proportional valve 112, a shutoff valve 116, the inlet valve 120, the delivery device 102, the outlet valve 122 and the chemical sensor 104. The fluid stream that includes the first pressure regulator 96, the first proportional valve 112, a shutoff valve 116, the inlet valve 120, the delivery device 102, the outlet valve 122 and the chemical sensor 104 lie is termed the first stream 202. The first stream 202 directs the carrier gas to the inlet port of the delivery device 102.

The chemical sensor 104 is in communication with the first proportional valve 112. In one embodiment, the chemical sensor 104 is in electrical communication with the first proportional valve 112. The proportional valve 112, a shutoff valve 116, the inlet valve 120, the delivery device 102, the outlet valve 122 and the chemical sensor 104 are in a closed loop.

The second pressure regulator 98 is disposed upstream of shutoff valve 118 and a coil of tubing 212. The coil of tubing 212 heats the carrier gas to the temperature inside heated enclosure 103. The fluid stream that includes the second regulator 98, the second valve 118 and the coil of tubing 212 is termed the second stream 204.

The first stream 202 contacts the second stream 204 to form the third stream 206. In one embodiment, the first stream 202 contacts the second stream 204 downstream of the outlet valve 122 of the delivery device 102. The chemical sensor 104 is disposed downstream of the outlet valve 122. Output signals from the chemical sensor 104 are directed to the first proportional valve 112 through the first controller 108.

In one embodiment, the heating jacket 103 (shown in the FIG. 3) encompasses the valves 116 and 118, the heater 212, substantially all of the first stream 202, substantially all of the second stream 204 and substantially all of the third stream 206. This arrangement permits maintaining the temperature of the gas stream (i.e., the carrier gas and the precursor vapor) in the system 100 at a temperature of greater than 20° C. at all times and prevents condensation of the vapor precursor in the first stream 202, the second stream 204 and the third stream 206. This permits a uniform delivery of precursor vapor to the reactor 200 or to a plurality of reactors. This arrangement overcomes a deficiency encountered in other comparative commercially available reactors where the precursor vapor often condenses on the inside walls of tubing leading to uneven delivery and distribution of precursor to the reactor.

In one manner of operating the delivery system 100 of the FIG. 3, the reactor 200 draws a mixture of the precursor vapor and the carrier gas from the delivery device 102. The chemical sensor 104 measures the precursor vapor concentration and/or the flow rate (or pressure) in the third stream 206. If the precursor vapor concentration and/or the flow rate in the third stream 206 lie outside desired limits, the sensor 104 communicates with the first proportional valve 112 through the first controller 108. The first controller 108 increases or reduces the voltage to the first proportional valve 112. By closing or opening the proportional valve 112, the flow rate (or the pressure) of the carrier gas or the concentration of the precursor vapors in the carrier gas will be adjusted to a desired value.

Figure 4:
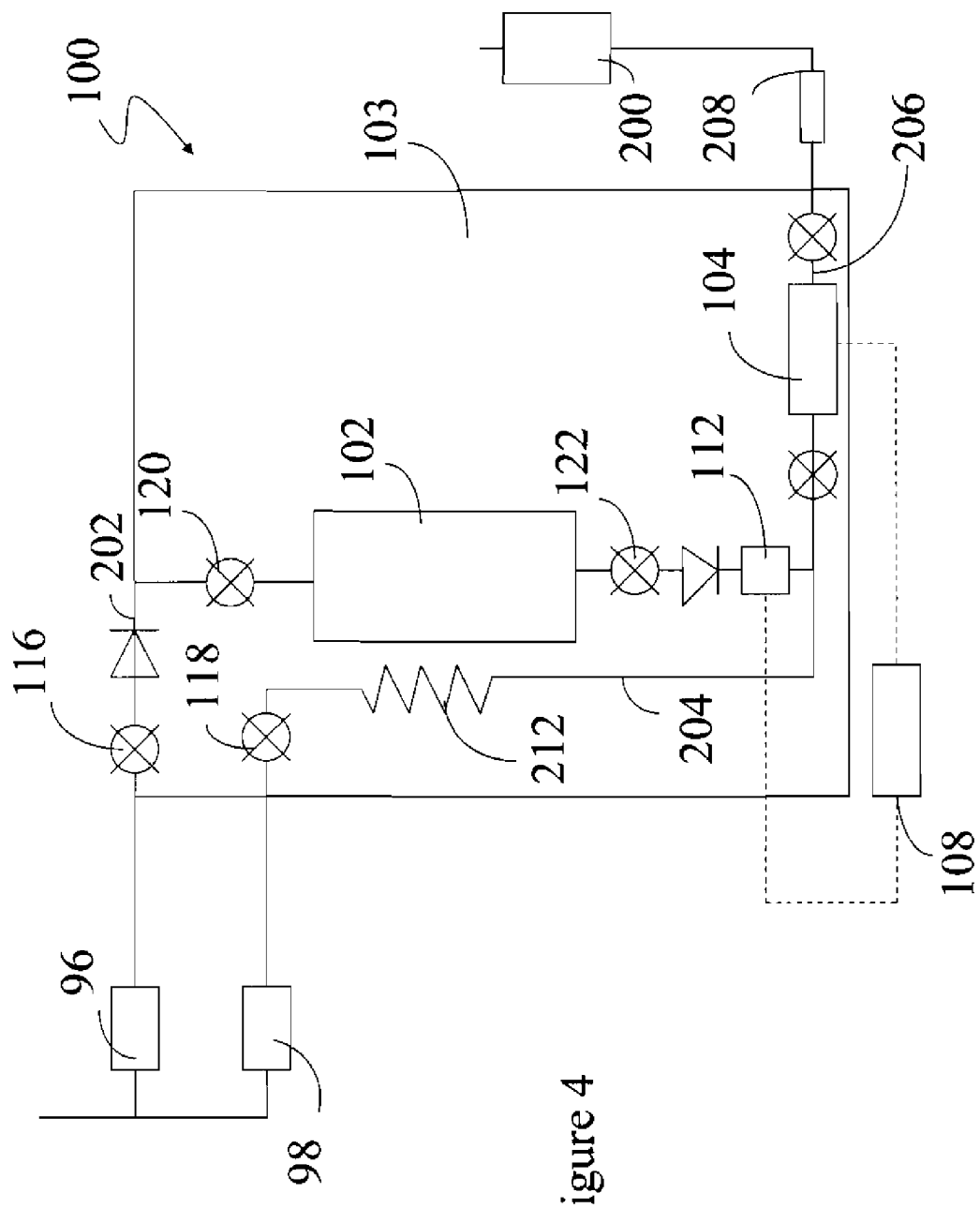
FIG. 4 is another schematic depiction of an exemplary delivery system where a single pressure/flow controller controls the mass flow rate through the delivery device and where the first proportional valve is disposed downstream of the delivery device.

The FIG. 4 depicts another embodiment of the delivery system 100 of the FIG. 3. In this embodiment, the first proportional valve 112 is disposed downstream of the delivery device 102 instead of upstream as depicted in the FIG. 3. This system also comprises the pressure regulators 96 and 98 that function to promote a drop in the pressure of the incoming carrier gas to a pressure level that is used by the mass flow controller 208 to feed the reactor 200.

With reference to the FIG. 4, it may be seen that disposed downstream of the first pressure regulator 96 is the shutoff valve 116, the inlet valve 120, the delivery device 102, the outlet valve 122, the first proportional valve 112 and the chemical sensor 104. The first proportional valve 112 is thus disposed downstream of the first pressure regulator 96 but is disposed upstream of the point where the first stream 202 contacts the second stream 204. The first stream 202 thus comprises the shutoff valve 116, the inlet valve 120, the delivery device 102, the outlet valve 122 and the first proportional valve 112. The first stream 202 directs the carrier gas to the inlet port of the delivery device 102.

The second stream 204 comprises the second valve 118 and the coil of tubing 212.

The first stream 202 contacts the second stream 204 to form the third stream 206. In one embodiment, the first stream 202 contacts the second stream 204 downstream of the first proportional valve 112. The chemical sensor 104 is disposed downstream of the first proportional valve 112. Output signals from the chemical sensor 104 are directed to the first proportional valve 112 through the first pressure/flow controller 108. The chemical sensor 104 is in electrical communication with the first proportional valve 112.

The disposing of the first proportional valve downstream of the delivery device 102 is advantageous in some instances to suppress concentration oscillations that may develop under certain flows through the delivery system 100. Because the pressure in the delivery device 100 is higher in this embodiment the flow through the delivery device 100 is usually higher to obtain the same concentration.

In one method of manufacturing the delivery system 100, the proportional valves 112 and/or 114 are disposed upstream of the delivery device 102. Shutoff valves 116 and/or 118 are disposed downstream of the proportional valves 112 and/or 114 respectively and upstream of the delivery device 102. The delivery device 102 is disposed in a heated enclosure 103. The inlet valve 120 and the outlet valve 122 are disposed at the inlet and the outlet respectively of the delivery device 102. The chemical sensor 104 and the pressure sensor 106 are disposed downstream of the delivery device 102 and form closed loops with the proportional valves 112 and/or 114 respectively. The delivery system 100 is in fluid communication with the reactor 200 via a mass flow controller 208. The mass flow controller 208 is disposed upstream of the reactor 200.

The delivery system 100 is advantageous in that it can deliver a constant stream of precursor vapor at a larger flow rate than other comparative devices. The method does not involve any opposing flows. The flow throughout the delivery system 100 involves flow in a single direction. This produces better mixing between the carrier gas and the precursor vapor and prevents the formation of holes in the solid precursor. Systems that have opposing flows suffer from the problems that occur when one of the flows increases in pressure over the other flow. This produces a non-uniform supply of the precursor vapor to the reactors. It also produces non-uniform sublimation of the solid precursor leading to holes in the solid precursor, which in turn gives rise to a non-uniform supply of the precursor vapor to the reactors.

The system 100 also permits the delivery of a uniform concentration of the precursor to the reactor 200. This feature distinguishes the system 100 over other comparative delivery systems that supply a constant number of moles per unit time. The delivery of a constant number of moles per unit time does not always translate to a constant number of moles per unit volume, especially when the system has opposing flows of carrier gas. This often gives rise to fluctuations of the precursor per unit volume of the carrier gas that is delivered to the reactor, which leads to the production of non-uniform products.

The disclosed system 100 also permits a uniform mass flow of the precursor to the reactor over a large period of time.

In one embodiment, the delivery system 100 can deliver the precursor vapor at rates greater than or equal to 1,500 micromoles per minute, specifically greater than or equal to 1,750 micromoles per minute and more specifically greater than or equal to 2,000 micromoles per minute at a temperature of greater than or equal to 60° C. and a pressure of greater than or equal to 900 torr (120 kPa), while maintaining carrier gas flow rates of greater than or equal to 1 standard liters per minute (slm), specifically greater than or equal to 2 standard liters per minute, and more specifically greater than or equal to 3 standard liters per minute to the reactor 200.

What is claimed is:

1. A delivery system comprising:
   a first stream comprising:
   a delivery device having an inlet port and an outlet port; the delivery device containing a solid precursor;
   a first proportional valve; the first proportional valve being in communication with the inlet port of the delivery device; wherein the first proportional valve is operative to control a flow of a first stream of carrier gas to the delivery device based on an applied voltage;
   a second stream comprising:
   a second proportional valve; the second proportional valve being in communication with the outlet port of the delivery device; wherein the second proportional valve is operative to control a flow of a second stream of carrier gas to the delivery device based on an applied voltage; and
   a mixing chamber; the mixing chamber being downstream of the delivery device and being operative to mix the first stream with the second stream; wherein the first stream and the second stream are mixed in a channel formed between a flange to a first conduit and a side of the mixing chamber; wherein the second stream bypasses the delivery device and contacts the first stream at a point downstream of the delivery device to form a third stream; where the third stream comprises:
   a chemical sensor; the chemical sensor being disposed downstream of the mixing chamber and being operative to analyze chemical contents of a fluid stream emanating from the mixing chamber; the chemical sensor being in communication with the first proportional valve; and
   a first pressure/flow controller being in operative communication with the chemical sensor and with the first proportional valve; and
   a pressure sensor that is in fluid communication with the delivery device; where the pressure sensor is operative to control the flow of the second stream; wherein the delivery system is operative to deliver a substantially constant number of moles of a precursor vapor per unit volume of a carrier gas to a plurality of reactors that are communication with the delivery system.

2. The delivery system of claim 1, wherein the mixing chamber is in fluid communication with a first conduit that contains the first stream and a second conduit that contains the second stream.

3. The delivery system of claim 2, wherein the first stream and the second stream flow in opposite directions prior to contacting one another.

4. The delivery system of claim 1, further comprising a second pressure/flow controller; the second pressure/flow controller being in electrical communication with the second proportional valve.

5. The delivery system of claim 1, where a first pressure/flow controller, the first proportional valve, the delivery device, the mixing chamber and the chemical sensor lie in a first closed loop.

6. The delivery system of claim 4, where the second pressure/flow controller, the second proportional valve, the mixing chamber and the pressure sensor lie in a second closed loop.

* * * * *